(12) United States Patent
Hollenbeck et al.

(10) Patent No.: US 7,403,071 B2
(45) Date of Patent: Jul. 22, 2008

(54) HIGH LINEARITY AND LOW NOISE AMPLIFIER WITH CONTINUOUSLY VARIABLE GAIN CONTROL

(75) Inventors: Neal W. Hollenbeck, Palatine, IL (US); Lawrence E. Connell, Naperville, IL (US); Daniel P. McCarthy, Elk Grove Village, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 157 days.

(21) Appl. No.: 11/374,870

(22) Filed: Mar. 14, 2006

(65) Prior Publication Data

US 2007/0216482 A1 Sep. 20, 2007

(51) Int. Cl.
*H03F 3/45* (2006.01)
(52) U.S. Cl. .................................... 330/254
(58) Field of Classification Search ............... None
See application file for complete search history.

(56) References Cited

U.S. PATENT DOCUMENTS

| | | | |
|---|---|---|---|
| 6,100,761 A * | 8/2000 | Ezell | 330/254 |
| 6,218,899 B1 | 4/2001 | Ezell | |
| 6,316,997 B1 * | 11/2001 | Tammone, Jr. | 330/254 |
| 6,985,036 B2 * | 1/2006 | Bhattacharjee et al. | 330/254 |
| 7,005,922 B2 * | 2/2006 | Oshima et al. | 330/278 |
| 7,034,606 B2 * | 4/2006 | Caresosa et al. | 327/563 |
| 7,084,704 B2 * | 8/2006 | Sowlati | 330/253 |

OTHER PUBLICATIONS

U.S. Appl. No. 11/329,752 entitled "Amplifier With Improved Noise Performance And Extended Gain Control Range", filed Jan. 10, 2006.

* cited by examiner

*Primary Examiner*—Robert J. Pascal
*Assistant Examiner*—Alan Wong
(74) *Attorney, Agent, or Firm*—Brinks, Hofer, Gilson & Lione (57) ABSTRACT

An amplifier, tuner, and method of amplification are provided. The amplifier has a pair of transistors. Each transistor has a control terminal and an output terminal disposed between the transistor and a power supply input. A first network is connected between each power supply input and output terminal. The first network contains a first resistor and a first switch connected in parallel with the first resistor. A second network is connected between the transistors. The second network contains a first and second combination. Each of the first and second combinations contains a second resistor and a second switch connected in parallel with the second resistor. The first and second combinations are connected by a third switch.

23 Claims, 5 Drawing Sheets

HIGH LINEARITY AND LOW NOISE AMPLIFIER WITH CONTINUOUSLY VARIABLE GAIN CONTROL

TECHNICAL FIELD

The present application relates to an amplifier. More specifically, the present application relates to an amplifier having continuously variable gain control, high linearity, and low noise.

BACKGROUND

Television tuners receive carriers over a predetermined range, e.g. from 50 MHz to over 860 MHz for some standards. This is a relatively wide range of frequencies compared to other electronic devices, such as cellular telephones, which operate over a frequency range of 100 MHz or so. The incoming signal power to a tuner can vary by many orders of magnitude depending on a variety of factors. For example, the distance of the tuner from the signal source or the environmental conditions may cause significant changes in the signal strength for mobile tuners. In cable systems, as many as 138 channels can be present, and each channel can vary by more than 30 dB.

The change in signal strength is problematic. As the signal is introduced to the tuner, the signal is amplified by a low noise amplifier (LNA). However, if the amplitude of the signal is too large, the LNA will distort the peaks of the signal and thus degrade the output of the tuner. Accordingly, it is desirable to provide continuous control of the gain of the tuner over a wide range of input analog voltages.

However, providing control adds complexity, as well as distortion and non-linearity problems when the gain control range is extended. Altering the gain of the tuner changes the noise figure and intermodulation distortion of the tuner; noise figure generally increases as the gain decreases while intermodulation distortion increases as the gain increases. The noise figure is the ratio of the total output noise power to the output noise due to a standard input source resistance, e.g. a 50 ohm resistance or 75 ohm resistance (for cable). Intermodulation distortion of the tuner is nonlinear distortion in the output of the tuner containing frequencies that are linear combinations of the fundamental frequencies and all harmonics present in the input signals. Thus, it is also desirable to provide good linearity and a good noise figure over the entire gain control range.

DETAILED DESCRIPTION OF THE EMBODIMENTS

A linear low-noise amplifier (LNA) and tuner are provided. The LNA is provided at the front end of the tuner. The LNA has a substantially continuously variable gain control. In addition, the LNA provides a relatively constant attenuation slope with low intermodulation distortion. The LNA is a common gate LNA having cross coupled input capacitors. Continuously variable gain control is achieved using a network of a resistor and switches in parallel which are turned on and off sequentially to provide linear attenuation. The gain is initially reduced at the output of the LNA as switches short out a load resistor of the LNA to reduce the noise figure degradation and provide good noise Figure performance. Integration of the front end LNA with the use of the attenuator lowers the overall cost of the tuner and increases flexibility.

Figure 1:
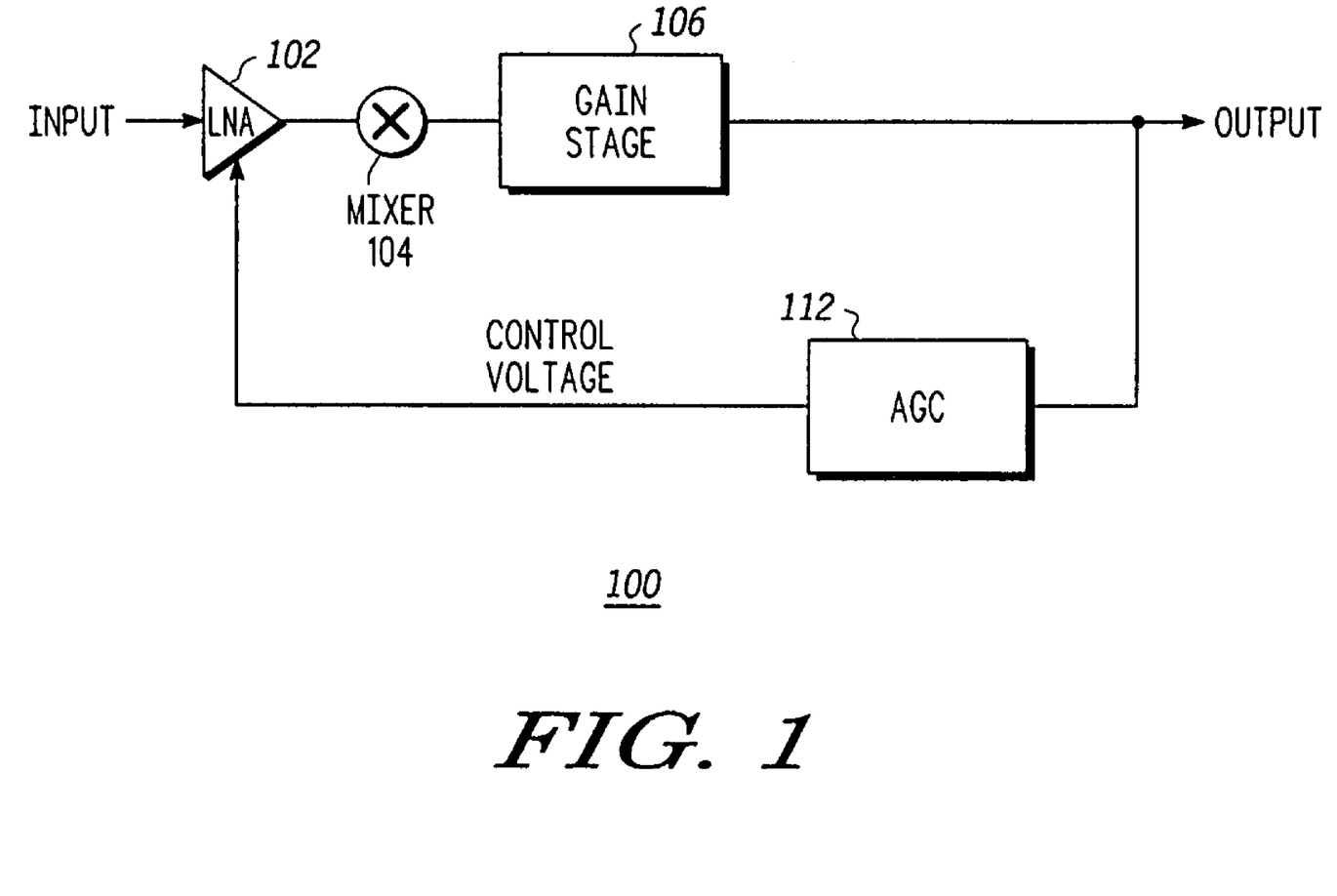
FIG. 1 is a block diagram of circuitry in a tuner in accordance with an embodiment of the invention.

FIG. 1 illustrates an embodiment of a block diagram of circuitry in a tuner. Although other circuitry may be present, such as an analog-to-digital (A/D) converter or coupling capacitors, such circuitry is not shown for clarity. The tuner 100 contains a linear low noise amplifier (LNA) 102 with continuously variable gain control, having an input connected to the input of the tuner 100. An input of a mixer 104 is connected to an output of the LNA 102. An output of the mixer 104 is connected to an input of a gain stage 106. An output of the gain stage 106 is connected to an input of an automatic gain controller (AGC) 112, whose output is connected to another input of the LNA 102. The output of the gain stage 106 may also be supplied as an output of the tuner 100. Additional gain stages and/or attenuators may be provided between the mixer 104 and gain stage 106 or gain stage 106 and output of the tuner 100. The gain stage 106 can have a fixed or variable gain. The output power of the tuner 100 can be constant in one embodiment. A signal of a predetermined frequency range (e.g. from 50 MHz to 860 MHz) is supplied to the LNA 102 through the input of the tuner 100. The signal is linearly amplified by the LNA 102 before being passed to the mixer 104. The mixer 104 down-converts the linearly amplified signal to a low intermediate frequency (IF) (44 MHz) before supplying the down-converted signal to the gain stage 106. The gain stage 106 amplifies the down-converted signal by a predetermined amount and then supplies the amplified signal to the AGC 112. The gain of amplifier LNA 102 is adjusted by an amount determined by the control voltage supplied from the AGC 112. In the AGC loop, the AGC 112 receives a feedback signal of the amplified signal from gain stage 106 and uses the feedback signal to adjust the control voltage, and thus, the amount of gain in LNA 102. For example, if the output of the tuner 100 is larger than a desired output voltage, the AGC 112 controls the variable gain amplifier LNA 102 to decrease the amount of gain while if the output of the tuner 100 is smaller than the desired output voltage, the AGC 112 controls the variable gain amplifier LNA 102 to increase the amount of gain. The desired output voltage may be determined by the module to which the output signal is supplied or some other criterion determined by the system.

Figure 2:
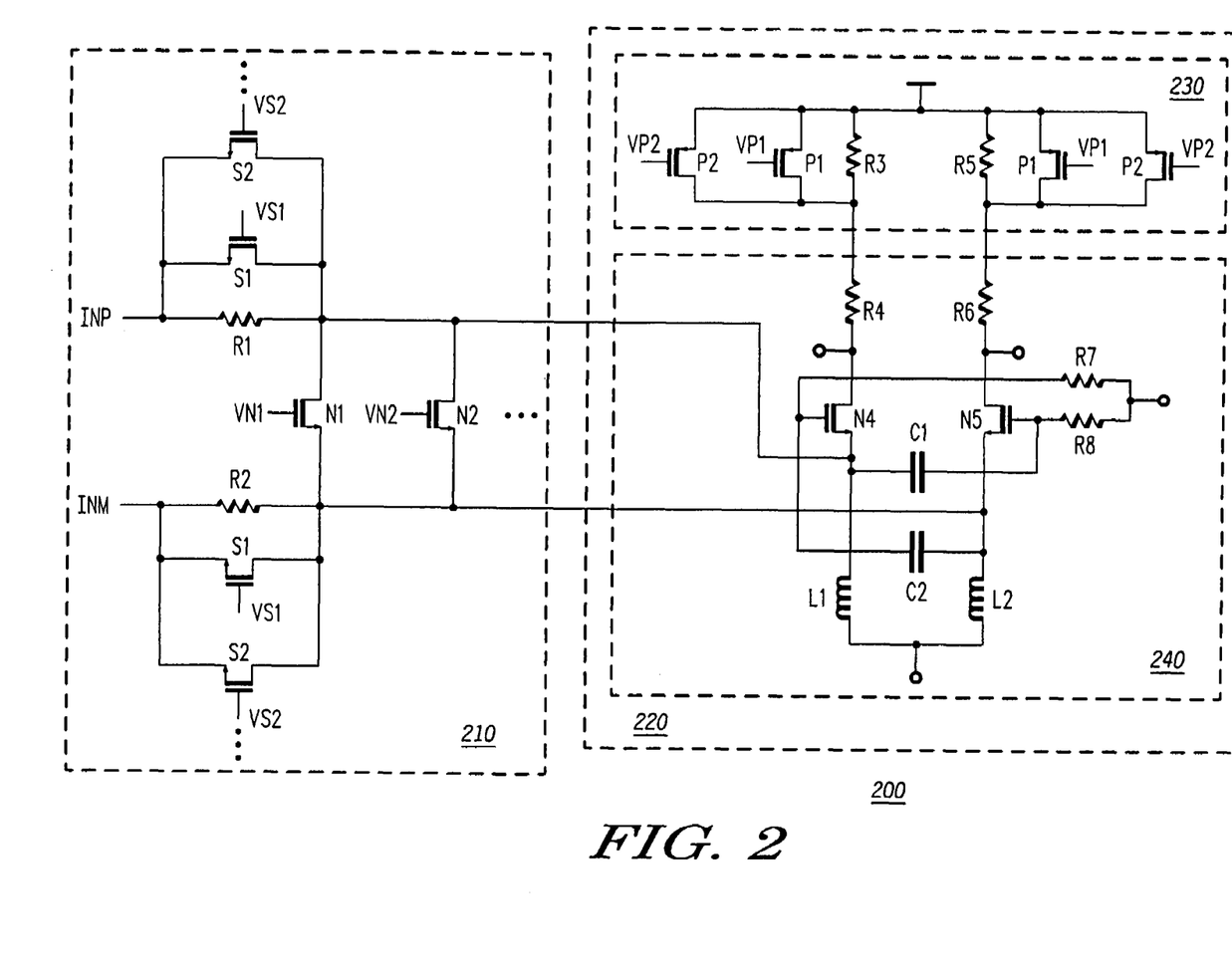
FIG. 2 illustrates an embodiment of the linear amplifier in accordance with an embodiment of the invention.

FIG. 2 illustrates one example of the LNA 102 in FIG. 1. The LNA 200 contains an attenuation section 210 and an amplification section 220. The amplification section 220 includes a variable resistance 230 and a gain stage 240. The attenuation section 210 and the amplification section 220 of the LNA 200 may be integrated on one integrated circuit (chip) or may be disposed on different chips.

The gain stage 240 contains a pair of matched transistors N4, N5. The transistors N4, N5 are MOSFETs (Metal-Oxide-Semiconductor FETs). A MOSFET has a gate (control terminal), a source from which carriers are provided, and a drain to which the carriers flow. Either n-channel or p-channel MOSFETs may be used (i.e. the carriers may be electrons or holes), although n-channel MOSFETs may be more desirable at least as a smaller device can be used to achieve the same gain.

Inductors L1, L2 are connected between the sources of the MOSFETs N4, N5 and a predetermined voltage such as ground. The inductors L1, L2 can be integrated in the same circuit as the MOSFETs N4, N5 or can be external. The attenuation section 210 is connected to the amplification section 220 at the sources of the MOSFETs N4, N5. Cross coupled input capacitors C1, C2 are connected between the gate of one of the MOSFETs N4, N5 and the source of the other of the MOSFETs N4, N5. The gates of the MOSFETs N4, N5 are connected to a single bias voltage through resistors R7, R8. Resistors R4, R6 are connected to the drains of the MOSFETs N4, N5. The differential output of the LNA 200 is taken from the nodes between the resistors R4, R6 and the MOSFETs N4, N5. The resistors R4, R6 are connected between the variable resistance 230 and the MOSFETs N4, N5.

The variable resistance 230 contains resistors R3, R5, each of which is connected in parallel with one or more switches P1, P2. The switches P1, P2 will be referred to as MOSFETs, although one or more of the switches may be other types of transistors. The gate of one of the MOSFETs P1 is connected to a first control voltage VP1, and the gate of another of the MOSFETs P2 is connected to a second control voltage VP2. Although two MOSFETs are shown, any number of MOSFETs may be connected in parallel. Characteristics of the MOSFETs P1, P2 in the variable resistance 230 are similar to that of the MOSFETs of the attenuation section 210.

Figure 3:
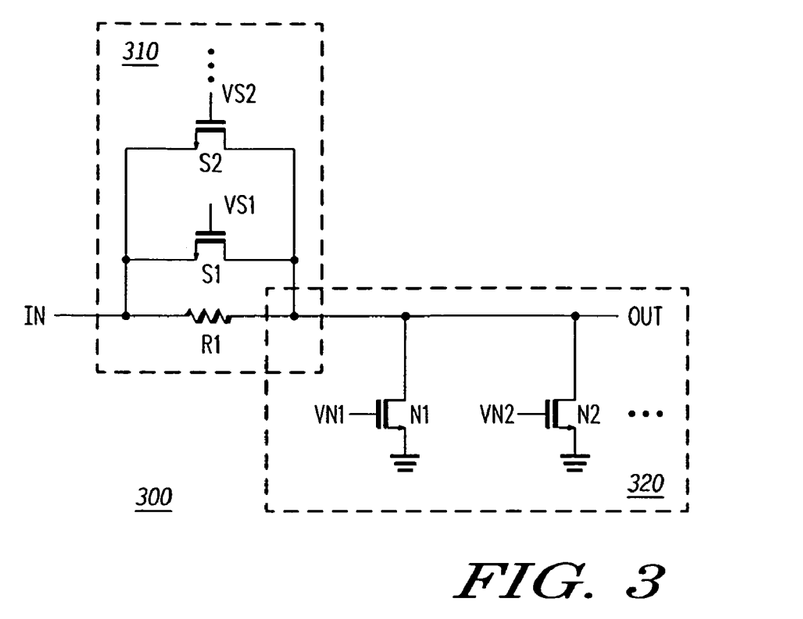
FIG. 3 shows an enlargement of one portion of the attenuation section in FIG. 2.

FIG. 3 is an enlargement showing the Inp portion 300 of the attenuation section 210 of the LNA 200 shown in FIG. 2. The Inp portion 300 includes a first parallel network 310 and a second parallel network 320. The Inp portion 300 is shown single ended for clarity, but can be implemented as a fully differential network as shown in FIG. 2.

The first network 310 is connected between the input of the LNA and to the output node of the Inp portion 300. The first network 310 contains a resistor R1 and at least one switch S1 connected in parallel with the resistor R1. In the embodiment shown in FIG. 3, the first network 310 contains a plurality of switches S1, S2 connected in parallel with the resistor R1. One side of each of the switches S1, S2 is connected to the input of the Inp portion 300 and an opposing side connected to the output node of the Inp portion 300. A control terminal of each of the switches S1, S2 is provided with a control voltage VS1, VS2 that activates/deactivates the switch S1, S2. Each of the control voltages VS1, VS2 may be the same or different than at least one other of the control voltage VS1, VS2.

The second network 320 is connected between the output node of the Inp portion 300 and ground for the single ended example, or the output of the Inm section for the differential case. The second network 320 contains at least one switch N1. In the embodiment shown in FIG. 3, the second network 320 contains a plurality of switches N1, N2 connected in parallel. One side of each of the switches N1, N2 is connected to the output node of the portion 300 and an opposing side connected to the predetermined voltage. A control terminal of each of the switches N1, N2 is provided with a control voltage VN1, VN2 that activates/deactivates the respective switch N1, N2. Each of the control voltages VN1, VN2 may be the same or different than at least one other of the control voltage VN1, VN2.

In the embodiment shown in FIG. 3, similar to above, the switches S1, S2, N1, N2 will be referred to as MOSFETs, although one or more of the switches may be other types of transistors. The MOSFET acts as a shunt resistor, having a large resistance when off (i.e. when the channel between the source and drain regions is closed) and having a substantially smaller resistance when on (i.e. when the channel is open). For example, assuming only MOSFET S1 is present: when the MOSFET S1 is off, the resistance may be 10 R1, while when the MOSFET S1 is on, the resistance may be 0.1 R1. In this case, when the MOSFET S1 is off, the resistance across the first network 310 is about R1 and when the MOSFET S1 is on, the resistance across the first network 310 is about 0.1 R1. Accordingly, the resistance of the first network 310 varies from a relatively larger value when the MOSFET S1 is off to a relatively smaller value when the MOSFET S1 is on. Each of the MOSFETs S1, S2 may have the same resistances or may have different resistances (when on and/or when off). In addition, the noise figure is reduced when the MOSFETs are on as the MOSFETs short out the noise from the resistors R1 and R2. External resistors may also be disposed in parallel with resistor R1 to reduce the series resistance.

Similarly, the resistance of the second network 320 varies from a relatively smaller value when the MOSFETs N1, N2 are on to a relatively larger value when the MOSFETs N1, N2 are off. Each of the MOSFETs N1, N2 may have the same resistances or may have different resistances (when on and/or when off). External resistors may also be disposed in parallel with switches N1, N2, etc. to increase the nominal attenuation of the network.

The first and second networks 310, 320 are disposed such that they form a voltage divider. That is, since one end of the second network 320 is grounded, when a voltage is applied to the Inp input of the LNA 200, the voltage at the Inp output node of the Inp portion 300 is the ratio of the resistance of second network 320 divided by the addition of the resistances of the first and second networks 310, 320. Accordingly, the attenuation of the Inp portion 300 is maximized when the resistance of the first network 310 is maximized and the resistance of second network 320 is minimized, and the attenuation of the Inp portion 300 is minimized when the resistance of the first network 310 is minimized and the resistance of second network 320 is maximized.

The control voltages are able to vary the attenuation of the Inp portion 300. By selection of the resistances of the MOSFETs and application of various control voltages to the MOSFETs, the slope of the attenuation curve of the attenuation portion 210 may be extended to be substantially linear over a relatively large range.

In more detail, the slope of the attenuation curve of a single MOSFET implemented as an attenuator increases as the MOSFET turns on. Assuming a continuous control voltage, as the control voltage increases, this slope reaches a maximum. Unfortunately, the slope does not stay constant as the control voltage keeps increasing. At a certain control voltage, the slope magnitude of the attenuation versus the control voltage curve begins to decrease. The drain-to-source resistance $R_{ds}$ of the MOSFET is given by (1).

$$R_{ds} = \frac{L}{\mu C_{ox} W (V_{gs} - V_T)} \quad (1)$$

In this equation, L is the length of the channel, μ is the mobility of the carriers, $C_{ox}$ is the capacitance formed across the oxide, W is the channel width, $V_{gs}$ is the gate-to-source voltage, and $V_T$ is the threshold voltage. Equation (1) shows that the resistance decreases as $V_{gs}$ increases. The attenuation of the input signal (in dB) for the circuit of FIG. 3 in which only resistor R1 and MOSFET N1 are present is given by (2).

$$Atten(dB) = 20 * \log\left(\frac{R_{ds}}{R_{ds} + R_1}\right) \quad (2)$$

This equation can be simplified and rewritten as shown by (3).

$$Atten(dB) = 20 * \log\left(\frac{1}{1 + R_1 K(V_{gs} - V_T)}\right) \text{ where } K = \frac{\mu C_{ox} W}{L} \quad (3)$$

If (3) is differentiated with respect to $V_{gs}$, the result is shown in (4).

$$\frac{\partial Atten(dB)}{\partial V_{gs}} = -\frac{20 R_1 K \log e}{1 + R_1 K (V_{gs} - V_T)} \quad (4)$$

If the source is grounded and the gate is supplied with the control voltage from the control terminal, as is the case in the arrangement of FIG. 3, (4) shows that for a control voltage just above $V_T$, the slope of the attenuation versus control voltage curve is approximately −20R1Kloge. As the control voltage rises, the slope decreases towards zero. This decrease in attenuation slope magnitude limits the attenuation range. Also, the slope of the attenuation for the single MOSFET case is dB linear over only a relatively small range of voltages, from about 1.3V to about 1.6V.

For a single MOSFET attenuator, a tradeoff exists between the attenuation slope and the attenuation range. By increasing the size (W/L ratio) of the MOSFET, the difference in MOSFET resistance when the MOSFET is on and when the MOSFET is off increases. Accordingly, the input signal can be attenuated many orders of magnitude between the on and off states of the MOSFET. As a result, the sensitivity of the attenuation control correspondingly increases. In other words, for very small changes in the gate voltage, there is a large change in the attenuation of the input signal. On the other hand, by decreasing the size of the MOSFET, the difference in MOSFET resistance when the MOSFET is on and when the MOSFET is off decreases. Accordingly, the input signal can be attenuated by a comparatively smaller amount. This correspondingly decreases the sensitivity of the attenuation control so that for large changes in the gate voltage, only a relatively small change in the attenuation of the input signal occurs.

If only a single MOSFET is used, a small fixed attenuation range is obtained if a particular linearity of the attenuation curve is to be maintained. This linearity of the attenuation curve may be of importance in mobile applications, where the received signal strength can vary quickly over time. However, the linearity of the attenuation section 210 of the LNA 200 is also degraded by the presence of the shunt MOSFET. When the control voltage is near the threshold voltage of the MOSFET, the MOSFET is in the saturation region (in which $V_{gs} > V_T$ and $V_{ds} > V_{gs} - V_T$, where $V_{ds}$ is the drain-to-source voltage) and exhibits non-linear behavior. As the voltage increases, the gate-to-source voltage of the MOSFET increases until the MOSFET enters the linear region (in which $V_{gs} > V_T$ and $V_{ds} < V_{gs} - V_T$). If an increased attenuation range is desired, a device of increased size is used. However, as the MOSFET size increases, the linearity of the attenuation section of the LNA decreases when the control voltage is near the threshold voltage.

Accordingly, as indicated above, one or more MOSFETs of the same or different sizes (resistances) may be used in each of the first and second networks 310, 320. Furthermore, by selecting the size of the MOSFETs in the attenuation section 210 and the variable resistance 230 of the amplification section 220, as well as the point at which the MOSFETs turn on (the control voltage), an extended range of linear attenuation can be provided.

Figure 4:
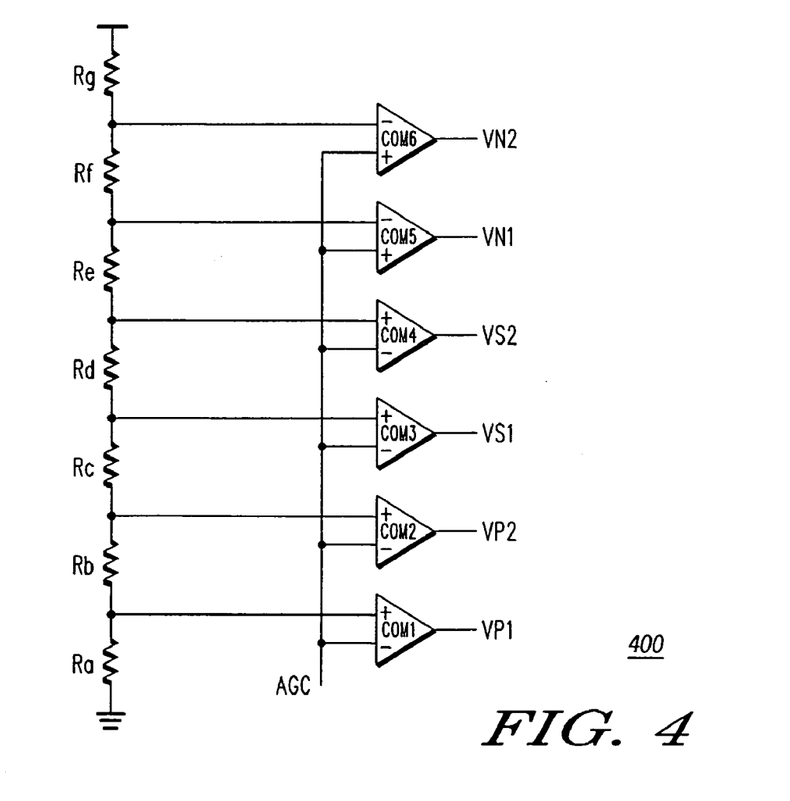
FIG. 4 shows a control voltage provider in accordance with an embodiment of the invention.

FIG. 4 illustrates an embodiment to set the control voltage for the MOSFETs P1, P2, S1, S2, N1, N2. To set the control voltage, a resistor chain Ra, Rb, Rc, Rd, Re, Rf, Rg is connected between a preset voltage, such as the power supply rail, and ground. The resistors Ra, Rb, Rc, Rd, Re, Rf, Rg act as voltage dividers between the preset voltage and ground and may have any desired value.

The nodes between the adjacent resistors in the resistor chain Ra, Rb, Rc, Rd, Re, Rf, Rg are connected to control terminals of the MOSFETs P1, P2, S1, S2, N1, N2 through a comparator Com1, Com2, Com3, Com4, Com5, Com6. More specifically, each node between a first set of the adjacent resistors in the resistor chain Ra, Rb, Rc, Rd, Re is connected to an non-inverting input of one of the comparators Com1, Com2, Com3, Com4 in a first set of the comparators, while an AGC voltage from an AGC is provided to the inverting input of the first set of the comparators Com1, Com2, Com3, Com4. Similarly, each node between a second set of the adjacent resistors in the resistor chain Re, Rf, Rg is connected to the inverting input of one of the comparators Com5, Com6 in a second set of the comparators, while an AGC voltage from the AGC is provided to the non-inverting input of the second set of the comparators Com5, Com6. The first set of comparators Com1, Com2, Com3, Com4 and the second set of comparators Com5, Com6 produce a first set of control voltage signals VP1, VP2, VS1, VS2, and a second set of control voltage signals VN1, VN2, respectively. The AGC voltage may be supplied from the AGC 112 or another AGC (not shown). The AGC voltage and/or the preset voltage may be a continuous analog voltage or a discrete digital voltage.

When the AGC voltage is zero, the MOSFETs S1, S2 in the first network 310 of the attenuation section 210 are on, and the MOSFETs N1, N2 in the second network 320 of the attenuation section 210 and the MOSFETs P1, P2 in the variable resistance 230 of the amplification section 220 and are off. As the AGC voltage (i.e. input/output signal strength) increases, the MOSFETs P1, P2 in the variable resistance 230 of the amplification section 220 turn on before the MOSFETs S1, S2 in the first network 310 of the attenuation section 210 turn off. The MOSFETs N1, N2 in the second network 320 of the attenuation section 210 turn on at some point depending on the resistances of the resistors in the resistor chain Ra, Rb, Rc, Rd, Re, Rf, Rg. For example, the MOSFETs N1, N2 in the second network 320 of the attenuation section 210 may turn on after the MOSFETs S1, S2 in the first network 310 of the attenuation section 210 turn off. In other embodiments, one or more of the MOSFETs N1, N2 in the second network 320 of the attenuation section 210 may turn on before one or more of the MOSFETs S1, S2 in the first network 310 of the attenuation section 210 turn off.

As the output of the comparators Com1, Com2, Com3, Com4, Com5, Com6 is one power supply rail or the other, the MOSFETs P1, P2, S1, S2, N1, N2 may be either fully on or off. In some embodiments, some of the MOSFETs can be close to the crossover point, i.e. not fully on or off. If a large number of parallel MOSFETs are used, e.g. greater than about 16 (for example 64), the resulting amplification curve can be substantially continuous. In other embodiments, the AGC voltage could be applied to the resistor chain and the control voltage taken directly from the nodes between adjacent resistors.

When all of the MOSFETs S1, S2 are on and the MOSFETs N1, N2, P1, P2 are off, the input impedance of the LNA is substantially the input impedance Rin of the amplification section 220. This provides maximum gain and minimum noise figure. When all of the MOSFETs S1, S2, N1, N2 are off, the input impedance of the LNA is substantially R1 plus Rin. R1 is sized such that the return loss variation over the attenuation range is small. When all of the MOSFETs S1, S2 are off and the MOSFETs N1, N2 are on, the input impedance of the LNA is substantially R1 since the impedance of the amplification section is essentially shorted out. To obtain the best noise figure, the attenuation is initiated by first turning on MOSFETs P1, P2.

Turning to using MOSFETs of different sizes, the channel lengths and/or widths can be varied. In some embodiments, the channel lengths remain constant while the channel widths vary. By varying the sizes of the MOSFETs P1, P2, S1, S2, N1, N2 and turning the MOSFETs P1, P2, S1, S2, N1, N2 on/off at different points, a better tradeoff between amplification range and slope can be obtained for the LNA 200. This arrangement permits the MOSFETs P1, P2, S1, S2, N1, N2 to compensate for non-linearity.

More specifically, in each network of MOSFETs of different sizes, the smaller MOSFETs remain in the linear region when the larger MOSFETs are in the saturation region. As the larger MOSFETs have smaller resistances than the smaller MOSFETs, and since the source/drain of the MOSFETs are connected in parallel, the effect of the saturation of the larger MOSFETs is decreased in significance by the smaller MOSFETs. This permits the overall amplification of the LNA 200 to increase substantially linearly. Thus, the acceptable range of amplification of differential signals supplied to the LNA 200 may be increased by adjusting the size (resistance) of the individual MOSFETs as well as the point at which the various MOSFETs are turned on and turned off.

Figure 5:
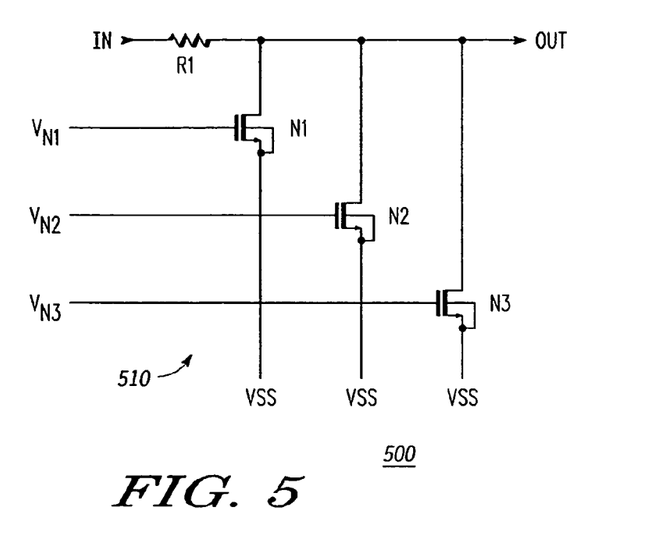
FIG. 5 shows an attenuation section with three MOSFETs of different sizes in accordance with an embodiment of the invention.
Figure 6:
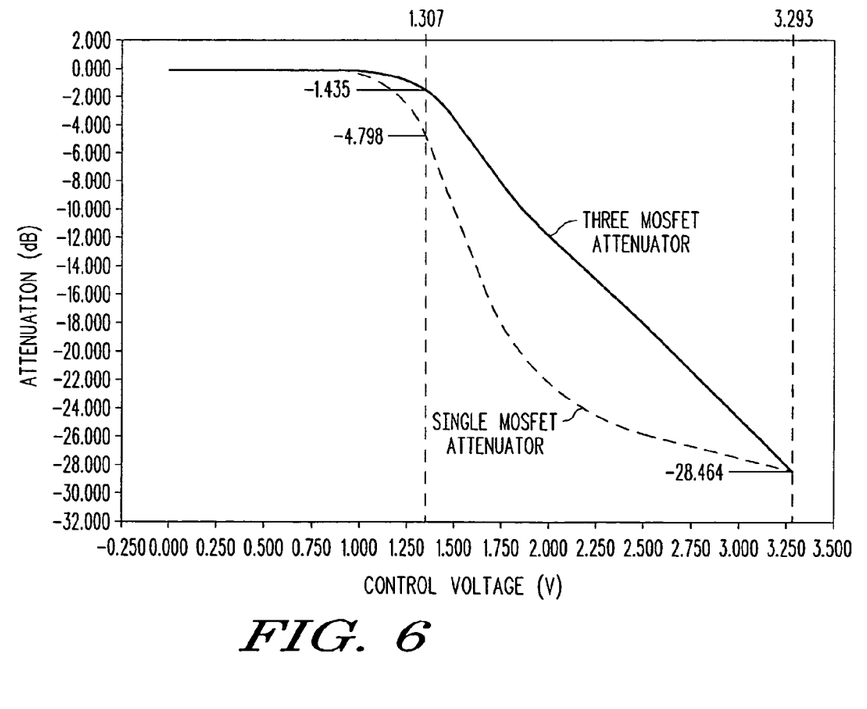
FIG. 6 is a plot of attenuation verses control voltage for a single MOSFET attenuation section and three MOSFET attenuation section in accordance with an embodiment of the invention.

The operation of the attenuation section 210 will be described with reference to the attenuation section shown in FIG. 5 and to the control voltage verses attenuation curve of FIG. 6 in which the control voltage changes constantly. As shown in FIG. 5, the MOSFETs S1, S2 are off and the MOSFETs N1, N2, N3 are either on or off. The MOSFETs N1, N2, N3 have different sizes. When operating, an input signal is supplied to the input IN. As the AGC voltage rises, MOSFET N1 will turn on first. The slope of the attenuation versus control voltage curve starts to increase to a maximum value determined essentially by the voltage divider of resistor R1 and the resistance of MOSFET N1. Eventually, the slope magnitude starts to decrease, as shown in equation (4), at which point MOSFET N2 starts to turn on. Thus, the attenuation slope stays substantially constant until the slope magnitude of the attenuation due to MOSFET N2 starts to decrease. At this point, the MOSFET N3 can start to turn on. This can continue until all of the MOSFETs are active.

The attenuation slope of the three MOSFET attenuation section is substantially constant over a much broader range of control voltages compared to the single MOSFET attenuation section. With judicious choice of the MOSFET size and resistor selection for both the resistor chain and the resistor R connected to the input of the LNA, a particular constant attenuation slope can be achieved for many orders of magnitude. Thus, a desired range and sensitivity to the AGC voltage can be achieved simultaneously. The AGC voltage extends to a maximum of 3.3V. In the plot shown in FIG. 6, a three MOSFET attenuation section with different MOSFET sizes (M3>M2>M1) was designed to give the same attenuation range as a single MOSFET attenuation section. The three MOSFET attenuation section was also designed to have an attenuation curve slope of −14 dB/V. As can be seen, the single MOSFET attenuation section is only dB/V linear for a small range of the control voltage, from about 1.3V to about 1.6V. The three MOSFET attenuation section is dB/V linear with an approximate slope of −14 dB/V for a much larger control voltage range, from about 1.3V to about 3.3V. This more linear in dB/V attenuation slope allows for a larger bandwidth AGC loop. This enables the LNA to be used in a mobile application where the received signal strength can vary quickly over time.

Turning to distortion of the tuner, the intermodulation distortion products produced by the LNA having a multiple MOSFET attenuation section is significantly less than that having a single MOSFET attenuation section. Since the first device to turn on has the smallest width (and thus has the smallest resistance), it does not have as negative of an effect on linearity as a larger device when the gate-to-source voltage is near threshold. As a larger MOSFET starts to turn on, the smaller MOSFET is well into the linear region. Thus, the initial non-linearities associated with the drain-to-source resistance of the larger MOSFET is decreased due to the presence of the more linear drain-to-source resistance of the smaller MOSFET. In the plot of FIG. 6, the linearities of the variable attenuators were simulated and compared. For a constant output power level of −25 dBm, the linearity of the variable attenuators were observed at attenuation levels from −1 dB to −25 dB with a −1 dB step. The worst intermodulation distortion over the entire attenuation range for a constant output power of −25 dBm was −56.2 dB for the single MOSFET attenuation section and −69.25 dB for the three MOSFET attenuation section. Thus, the three MOSFET variable attenuator shown in FIG. 5 has an improved intermodulation distortion level of +13 dB over the single MOSFET attenuation section as well as a more constant attenuation slope over the same attenuation range.

Figure 7:
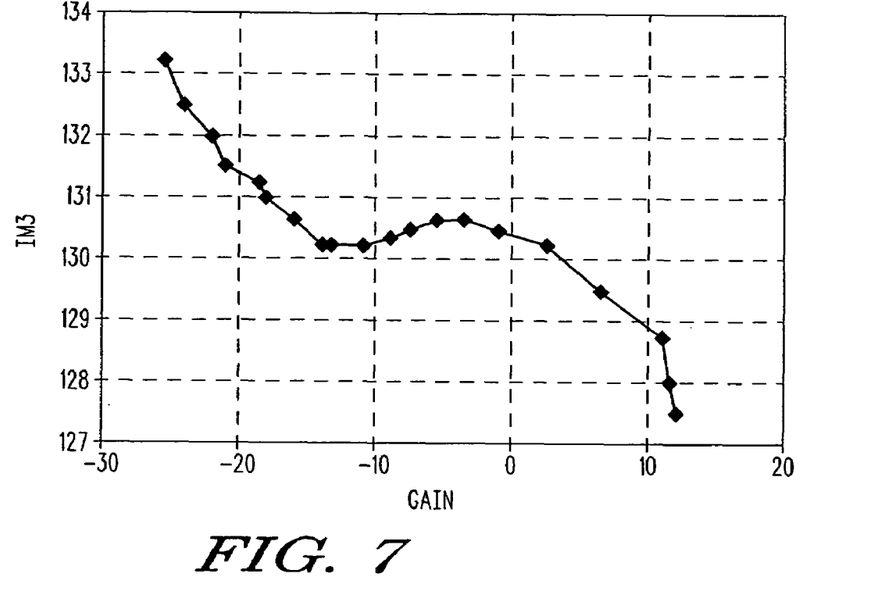
FIG. 7 is a plot of third order intermodulation distortion vs. gain for a linear amplifier in accordance with an embodiment of the invention.

Turning to characteristics of the overall LNA shown in FIG. 2, a graph of the third order intermodulation distortion (IM3) is shown in FIG. 7. One source of intermodulation distortion is the non-linearity in a MOSFET as it transitions from off to on. By placing multiple MOSFETs in parallel and turning them on sequentially, the non-linearity of each MOSFET is attenuated as it is in parallel with multiple MOSFETs that respond linearly. Thus the input signal is continuously attenuated while the effects of the nonlinear MOSFET region are significantly reduced. In the graph, the gain of the LNA varies about 40 dB, from about 12 dB (full gain) to about −28 dB (full attenuation). The intermodulation distortion decreases over a very small amount, from about 133 dB at a gain of about −28 dB to about 127 dB at a gain of about 12 dB. Thus, the plot in FIG. 7 shows that the intermodulation distortion is only degraded 5 dB for 40 dB of gain variation.

Figure 8:
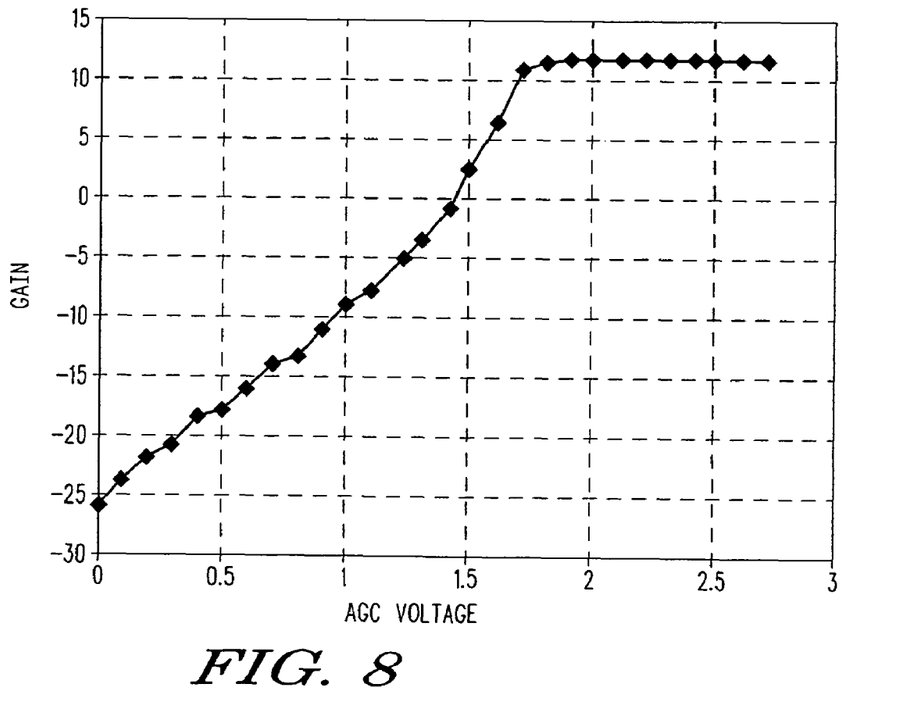
FIG. 8 is a plot of gain vs. AGC voltage for a linear amplifier in accordance with an embodiment of the invention.

The linearity of the gain of the LNA is shown in FIG. 8. The gain of the LNA increases substantially linearly with increasing AGC voltage until the LNA gain stops increasing at a predetermined gain. As illustrated, the gain increases over about 37 dB, from about −25 dB to about 12 dB over an AGC range of about 1.7V.

Although only the use of MOSFETs as switches has been discussed, any FET (Field Effect Transistors) or other device(s) can be used, as long as it provides the desired characteristics. For example, MISFETs (Metal-Insulator-Semiconductor FETs) may be used rather than MOSFETs. By using CMOS, however, the current drain of the LNA does not change substantially across the amplification range. Although the MOSFETs are described as having different sizes, and thus different drain-to-source resistances, two or more of the MOSFETs can have the same size while being connected to different nodes of the resistor chain or multiple MOSFETs can be connected to the same node. In one embodiment, the multiple MOSFETs have the same channel width to provide an effective channel width. In another embodiment, at least one of the multiple MOSFETs has a different channel width than another of the multiple MOSFETs.

Similarly, MOSFETs of various lengths can be used. However, as the length of the MOSFET increases, so does the minimum resistance. In addition, any number of resistors can be used. Other elements such as resistors may be connected in series with the MOSFETs, for example. A resistor that is much larger than the source-to-drain resistance may be disposed between the source and drain of the MOSFET. The LNA may be used in devices other than tuners, for instance, cable modems, radios, cellular telephones, PDAs, laptop computers or other communication devices or systems that use a variable gain amplifier.

Thus, an LNA with an attenuation section and amplification section is described. The attenuation section and amplification section have networks of parallel switches in which each switch is sequentially turned on or off. A first network is placed across an LNA input resistor to provide good noise figure during maximum gain conditions. A second network is placed across an LNA output resistor to provide good linearity and reduce noise figure degradation with attenuation. A third network is placed at the output of the LNA input resistor to provide a large gain control range with good linearity. A high linearity LNA with continuously variable gain control is achieved using one or more networks at both the LNA input and output, each network comprised of two or more MOSFET devices connected in parallel which are turned on or off sequentially to provide linear attenuation. Using the networks, intermodulation distortion products are reduced and the linearity and range of the gain control are increased. The number and size of the switches determine the level of intermodulation distortion products, the gain range, and the slope and shape of the gain curve. The shape of the gain curve can be configured to be any shape desired, such as linear or exponential.

Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. An amplifier comprising:
a pair of transistors each having a control terminal;
an output terminal of the amplifier disposed between each transistor and a power supply input;
a first network connected between each power supply input and output terminal, the first network containing a first resistor and a first switch connected in parallel with the first resistor; and
a second network connected between the transistors, the second network containing a first and second combination, each of the first and second combination containing a second resistor and a second switch connected in parallel with the second resistor, the first and second combination connected by a third switch.

2. The amplifier of claim 1, wherein each transistor and switch comprises a field effect transistor (FET).

3. The amplifier of claim 2, further comprising a first capacitor and a second capacitor, the first capacitor connected between the control terminal of a first transistor of the pair of transistors and a source of a second transistor of the pair of transistors, the second capacitor connected between the control terminal of the second transistor and a source of the first transistor.

4. The amplifier of claim 1, further comprising a resistor chain between a first predetermined voltage and a second predetermined voltage smaller than the first predetermined voltage, the control terminals of the switches connected with nodes between resistors in the resistor chain.

5. The amplifier of claim 4, further comprising comparators connected between the nodes and the control terminals of the switches.

6. The amplifier of claim 5, wherein the control terminals of the switches are connected with the resistor chain and comparators such that as a gain of the amplifier decreases from a maximum gain to a minimum gain, the first switch turns on before the second switch turns off and the second switch turns off before the third switch turns on.

7. The amplifier of claim 1, wherein The first network comprises a plurality of first switches, each of the first and second combination comprises a plurality of second switches, and the first and second combinations are connected by a plurality of third switches.

8. The amplifier of claim 7, wherein at least one of the first switches, second switches, or the third switches comprise at least two switches of different sizes.

9. The amplifier of claim 7, wherein the number of each of the first switches, second switches, and third switches is large enough such that an amplification curve of the amplifier is substantially continuous.

10. A tuner comprising:
an amplifier configured to amplify input signals, the amplifier containing:
a pair of transistors each having a control terminal,
an output terminal of the amplifier disposed between each transistor and a power supply input,
a first network connected between each power supply input and output terminal, the first network containing a first resistor and a first switch connected in parallel with the first resistor, and
a second network connected between the transistors, the second network containing a first and second combination, each of the first and second combination containing a second resistor and a plurality of second switches connected in parallel with the second resistor, the first and second combination connected by a plurality of third switches, a mixer configured to down-convert the amplified signals; and a gain stage configured to amplify the down-converted signals.

11. The tuner of claim 10, wherein each transistor and switch comprises a field effect transistor (FET).

12. The tuner of claim 10, further comprising a resistor chain between a first predetermined voltage and a second predetermined voltage smaller than the first predetermined voltage, the control terminals of the switches connected with nodes between resistors in the resistor chain.

13. The tuner of claim 12, further comprising comparators connected between the nodes and the control terminals of the switches.

14. The tuner of claim 13, wherein the control terminals of the switches are connected with the resistor chain and comparators such that as a gain of the amplifier increases from a minimum gain to a maximum gain, the first switches turn off before the second switches turn off and the second switches turn off before the third switches turn on.

15. The tuner of claim 14, wherein at least one of the first switches, second switches, or the third switches comprise at least two switches of different sizes.

16. An electronic device comprising the tuner of claim 10.

17. A method of amplifying a signal using an amplifier having a pair of transistors, the method comprising:

providing an input signal to be amplified;

adjusting a gain of the amplifier between a minimum gain and a maximum gain as the strength of the input signal varies by varying an impedance between each transistor and a power supply input based on an automatic gain controller control voltage, and by varying an impedance of a connection between the transistors based on the automatic gain controller control voltage.

18. The method of claim 17, wherein the connection between the transistors comprises a first and second combination and a plurality of first switches between the first and second combination, each of the first and second combination containing a resistor and a plurality of second switches connected in parallel with the resistor.

19. The method of claim 18, further comprising decreasing the impedance between each transistor and the power supply input, increasing the impedance of each of the first and second combination, and decreasing an impedance between the first and second combination in that order as the gain varies between the maximum gain and the minimum gain.

20. The method of claim 18, wherein at least one of the first switches or second switches comprise at least two switches of different sizes.

21. The method of claim 17, wherein the impedance between each transistor and the power supply input comprises a second resistor and a plurality of third switches connected in parallel with the second resistor.

22. The method of claim 17, further comprising:

comparing the automatic gain controller control voltage with a predetermined voltage; and adjusting the gain of the amplifier between the minimum gain and the maximum gain as the strength of the input signal varies by varying the impedance between each transistor and the power supply input based on the comparison, and by varying the impedance of the connection between the transistors based on the comparison.

23. The method of claim 22, wherein the predetermined voltage comprises a divided voltage derived from the power supply input.

* * * * *